United States Patent [19]

Singh et al.

[11] 4,146,309
[45] Mar. 27, 1979

[54] PROCESS FOR PRODUCING EVAPORATED GOLD FILMS

[75] Inventors: Shobha Singh, Summit; LeGrand G. Van Uitert, Morris Township, Morris County; George J. Zydzik, Columbia, all of N.J.

[73] Assignee: Bell Telephone Laboratories, Incorporated, Murray Hill, N.J.

[21] Appl. No.: 885,446

[22] Filed: Mar. 10, 1978

[51] Int. Cl.² ............................................. G02F 1/17
[52] U.S. Cl. .............................. 350/357; 427/125; 427/126; 427/404; 427/419 R; 428/469; 428/472; 428/432; 428/917; 428/539
[58] Field of Search .............. 428/469, 472, 539, 917, 428/432; 427/125, 126, 404, 419 R; 350/357

[56] References Cited

U.S. PATENT DOCUMENTS

| Re. 28,199 | 10/1974 | Deb | 350/357 |
|---|---|---|---|
| 2,750,832 | 6/1956 | Morgan | 428/472 |
| 2,915,153 | 12/1959 | Hitchcock | 428/469 |
| 3,463,663 | 8/1969 | Chopra | 428/469 |
| 3,578,843 | 5/1971 | Castellion | 350/357 |
| 3,630,603 | 12/1971 | Lotter | 350/357 |
| 3,829,196 | 8/1974 | Deb | 350/357 |
| 3,840,286 | 10/1974 | Kiss | 350/357 |
| 4,004,057 | 1/1977 | Hoffman | 428/469 |

*Primary Examiner*—Ellis P. Robinson
*Attorney, Agent, or Firm*—Walter G. Nilsen

[57] ABSTRACT

A process is described for producing devices with gold films on surfaces composed of certain inorganic fluoride compounds. An adhesion compound such as lead fluoride, cadmium fluoride or tin fluoride or mixtures of these compounds is interspersed between inorganic fluoride surface and gold film. This process is particularly attractive for the fabrication of electrochromic display devices and solid-state switches. This procedure insures good adhesion of gold film to inorganic fluoride and insures high reliability in the manufacture of such devices. In addition, electrodes made in accordance with the invention have highly desirable electrical characteristics including ohmic resistance characteristics and low electrode resistances.

16 Claims, 2 Drawing Figures

PROCESS FOR PRODUCING EVAPORATED GOLD FILMS

BACKGROUND OF THE INVENTION

The invention is a process for producing devices with evaporated gold films and devices with gold films.

Gold films are extensively used in the production of various devices. Such films are particularly important in electronic circuitry because of the inert character of gold metal and its excellent electrical conductivity properties. Particularly convenient for producing gold films is evaporation. This procedure is generally carried out in an evacuated chamber. It is highly desirable to have a rapid reliable method of evaporating gold on a surface which produces gold films with good adhesion to the surface and good electrical properties. This is particularly true of surfaces composed of certain inorganic fluorides useful in the fabrication of various devices and articles. Also included in these inorganic fluorides are the so called mixed fluorides such as chlorofluorides.

SUMMARY OF THE INVENTION

The invention is a procedure for producing articles or devices with evaporated gold film and articles made from such processes. Although pure gold is usually used in the evaporated gold films, films with at least 80 percent by weight gold are useful. The procedure involves use of a binding compound between the gold film and a surface composed of certain inorganic fluroide. This binding film is either lead fluoride, cadmium fluoride or tin fluoride or mixtures of these compounds. Gold films produced in accordance with this invention are found to have extraordinarily good adhesion to the inorganic fluoride surface and also exhibit good electrical conductivity properties. In particular, electrodes made in accordance with this procedure exhibit ohmic conductivity characteristics and have low resistances. These properties are highly advantageous because they increase device reliability and reduce undesirable heating effects and electrical power consumption between the gold film and fluoride surface. Further, it reduces voltage requirements since device performance often depends on the voltage drop across the inorganic fluoride and not on voltage drop between gold film and inorganic fluoride surface.

DETAILED DESCRIPTION

Figure 1:
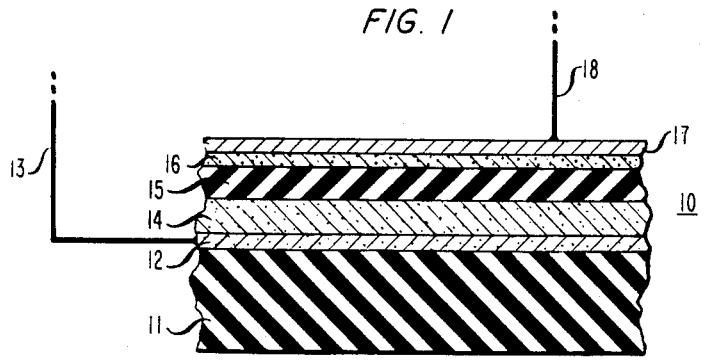
FIG. 1 shows a side view of an electrochromic display device with gold film over a surface of lithium fluoride with lead fluoride used as a binding film.

The essential feature of the invention is the use of certain inorganic fluoride compounds (lead fluoride, cadmium fluoride, and tin fluoride) as binding films in the bonding of evaporated gold films to certain inorganic fluoride surfaces. Such inorganic fluoride surfaces are useful in a large variety of devices including electrochromic displays, electrochromic switches, and certain capacitors and resistors containing inorganic fluorides. The invention pertains particularly to inorganic fluorides which are solids at ambient temperatures and in which gold adhesion is often a problem. More particularly it applies preferably to inorganic fluorides with cations other than post transition metal ions since the post transition metal ions generally have good adhesion to gold. Specifically these cations are the Group I-A elements (lithium, sodium, potassium, rubidium, cesium), the II-A elements (beryllium, magnesium, calcium, strontium, and barium) and the Group III-A elements (scandium, the transition-metal ions, atomic numbers 22–28, 40–46, 72–78, yttrium, lanthanum and the rare-earth elements, atomic numbers 57–71 and 89–102). Particularly useful are surfaces of LiF, $MgF_2$ and $LaF_3$ because of their use in various type devices including electrochromic devices, solid-state switches, etc. Rare-earth fluorides with atomic numbers 57–71 are also preferred because of their similarity to the lanthanum trifluorides. It is believed that these compounds occlude $H_2O$ and thereby act as sources of protons (and possibly lithium ions in the case of LiF) for injection into electrochromic materials such as $WO_3$. Other fluorides may be useful but often such substances do not have physical properties suitable for use as a surface.

In general the bonding film may be lead fluoride, cadmium fluoride, or tin fluoride or mixtures of these substances. Lead fluroide is preferred because it gives the exceptionally good adherence, excellent electrical contact properties and resists electrical migration under the influence of an electrical field. One of the advantages of the process is the relative simplicity of the procedure. The binding film may be interposed between the inorganic fluoride and gold layer in a variety of ways. Generally it is most convenient to evaporate a relatively thin layer of binding film onto the inorganic fluoride surface prior to gold evaporation. Thickness of the binding film generally is not critical but might depend on the type of device performance required. Thickness of 25 to 2000 Angstroms are convenient and result in good adhesion and electrical properties. Larger thicknesses are not detrimental in certain cases but may be wasteful of material and deposition time. Also, for electrical devices, much of the voltage drop in the device will reside in the binding layer which for some applications is undesirable. Extremely thin layers (down to a few Angstroms) provide prefectly good results provided substantially the entire surface is covered. Minimum thicknesses are set so as to insure coverage of the entire surface and insure good binding of the gold layer. A thickness between 25 and 100 Angstroms is preferred because it reliably leads to good, adherent gold layers without excessive use of material and without excessive voltage drop in the binding layer.

Evaporation pressure also is not generally critical but typical pressures are about $10^{-3}$ to $10^{-6}$ torr. Often it is advantageous to flush the vacuum system with an inert gas such as argon before evaporation takes place. In the fluoride evaporation, temperature including substrate temperature is not usually a critical parameter other than avoiding temperatures destructive to substrate fluoride etc. For example, it is preferred that the substrate temperature remain below the melting point of the fluoride used in the binding film and inorganic fluoride surface. In the fluoride evaporation it is most preferred for convenience that the temperature be approximately ambient temperature.

One of the advantages of using the evaporation procedure to produce the binding film is the relatife simplicity of the procedure. To avoid contamination of the surface during the process and for relative convenience successive evaporation of the fluoride binder and the gold is preferred.

Gold evaporation may also be carried out over a wide range of temperatures. However, it is preferred that the substrate be in a temperature range between 80 and 180 degrees C gith 140-160 most preferred. High temperatures are preferred so as to improve the adhesion of the gold layer to the fluoride surface and to insure the desirable electric characteristics of electrodes made by this method. Excessively high temperatures, generally above 180 degrees C., lead to puddling or isolated islands of gold film. This condition usually will disappear if the gold film is made sufficiently thick. However, particularly for thin gold films (generally between 50 and 500 Angstroms) a temperature range below 160 degrees C is preferred. Often gold films are made by first making a thin (up to about 500 Angstroms) film first in the preferred temperature range and then increasing the thickness of the gold film by further evaporation outside the preferred temperature range.

The inventive process for producing evaporated gold films is particularly useful in fabricating certain electrochromic display devices and electrochromic solid state electrical switches. Various electrochromic materials may be used including tungsten trioxide, molybdenum trioxide, and vanadium pentoxide. Tungsten trioxide is preferred because of its excellent electrochromic properties. These devices appear to operate by injecting various ions (e.g., protons, lithium ions, etc.) into the electrochromic material thereby converting the material from one state to another (generally insulator to conductor). Because of the ion injection required in these devices, inorganic fluorides must be located in close proximity to electrochromic material and a conducting electrode such as gold. Particularly effective materials for ion injection into electrochromic materials are lithium fluoride, magnesium fluoride, lanthanum fluoride and the rare earth trifluorides. Because of the difficulty in making satisfactory bonds between gold metal and these fluoride compounds it is particularly adfantageous to use a bonding film to produce adherent bonds. Gold films made in accordance with the invention are strongly adherent to the inorganic fluoride surface and exhibit low electrical resistance and ohmic contact characteristics. This is particularly important in electrochromic devices because it is desirable that the electrical field gradient necessary for ion injection be concentrated in the inorganic fluoride material rather than concentrated by the gold film and inorganic fluoride surface.

FIG. 1 shows a typical electrochromic device 10 with substrate 11 generally made from glass or other insulating material. On top of the substrate is a transparent conducting material 12 generally made of indium tin oxide. Electrical connection is made to the layer using a conducting path 13. Covering the transparent conducting layer is a layer of electrochromic material 14 generally comprising tungsten trioxide. On top of the electrochromic layer is a source of injection ions 15 which here is lithium fluoride. Next a layer of binding film 16 generally made of lead fluoride is used to insure good adhesion of the gold layer 17 to the lithium fluoride layer 15. Electrical contact to the gold layer is made by means of a conducting path 18.

Figure 2:
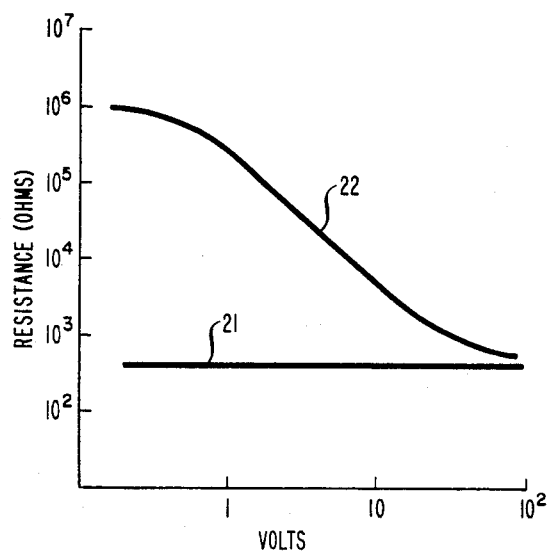
FIG. 2 shows a comparison of the ohmic characteristics of two electrodes one made without the binding film and one made in accordance with the invention.

A typical comparison between an ohmic contact 21 and a nonohmic contact 22 is shown in FIG. 2. In an ohmic contact the resistance remains constant even down to very low voltages. In a nonohmic contact, typical of curve 22, the resistance increases markedly at low voltages. Devices with gold films made in accordance with the invention exhibit ohmic electrical contacts typically represented by the curve marked 21 in FIG. 2.

I claim:

1. A process for producing a device with at least one metal layer on a solid inorganic fluoride surface in which the solid inorganic fluoride surface comprises an inorganic fluoride selected from the group consisting of lithium fluoride, sodium fluoride, potassium fluoride, rubidium fluoride, cesium fluoride, beryllium fluoride, magnesium fluoride, calcium fluoride, strontium fluoride, barium fluoride, scandium fluoride, transition-metal fluoride, yttrium fluoride, lanthanum fluoride, and rare-earth fluoride, said metal layer consisting of at least 80 percent gold by weight in which the metal layer is put down on the surface by evaporation characterized in that prior to the gold evaporation the solid inorganic fluoride surface is coated with a binding layer comprising at least one fluoride material selected from the group consisting of $PbF_2$, $CdF_2$, and $SnF_2$.

2. The process of claim 1 in which the metal layer consists essentially of gold.

3. The process of claim 1 in which the fluoride material consists essentially of $PbF_2$.

4. The process of claim 1 in which the surface is coated with fluoride material by evaporation of the fluoride material.

5. The process of claim 4 in which the thickness of the binding layer is between 25 and 2000 Angstroms.

6. The process of claim 5 in which the thickness of the binding layer is between 25 and 100 Angstroms.

7. The process of claim 4 in which the fluoride material is between 80 and 180 degrees C during gold evaporation.

8. The process of claim 7 in which the temperature of the fluoride material is between 140 and 160 degrees C during gold evaporation.

9. The process of claim 1 in which the inorganic fluoride is selected from the group consisting of lithium fluoride, magnesium fluoride, lanthanum fluoride, and rare-earth fluoride.

10. The process of claim 1 in which the device is an electrochromic device in which electrochromic material is put down onto a substrate, at least a portion of the surface of the electrochromic material is covered with solid inorganic fluoride, then at least a portion of the solid inorganic fluoride is covered with a binding layer and then at least a portion of the binding layer is covered with gold by evaporation.

11. The process of claim 10 in which the electrochromic material is selected from the group consisting of $WO_3$, $MoO_3$, and $V_2O_5$.

12. The process of claim 11 in which the electrochromic material is $WO_3$.

13. The process of claim 10 in which the electrochromic material, solid inorganic fluoride, binding layer, and gold are put down by evaporation.

14. A device comprising a solid inorganic fluoride layer in which the solid inorganic fluoride surface comprises an inorganic fluoride selected from the group consisting of lithium fluoride, sodium fluoride, potassium fluoride, rubidium fluoride, cesium fluoride, beryllium fluoride, magnesium fluoride, calcium fluoride, strontium fluoride, barium fluoride, scandium fluoride, transition-metal fluoride, yttrium fluoride, lanthanum fluoride, and rare-earth fluoride, and a metal layer consisting of at least 80 percent by weight gold characterized in that a binding layer comprising at least one fluoride material selected from the group consisting of $PbF_2$, $CdF_2$ and $SnF_2$ is interposed between inorganic fluoride layer and metal layer.

15. The device of claim 14 in which the fluoride material consists essentially of $PbF_2$.

16. The device of claim 14 in which the device comprises a substrate layer of electrochromic material, layer of solid inorganic fluoride, layer of $PbF_2$ and metal layer.

* * * * *